(12) United States Patent
Adut

(10) Patent No.: US 9,236,840 B1
(45) Date of Patent: Jan. 12, 2016

(54) LINEAR BROADBAND PNP AMPLIFIER

(71) Applicant: Linear Technology Corporation, Milpitas, CA (US)

(72) Inventor: Joseph Adut, Palo Alto, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/477,534

(22) Filed: Sep. 4, 2014

(51) Int. Cl.
*H03F 3/45* (2006.01)

(52) U.S. Cl.
CPC .... *H03F 3/4508* (2013.01); *H03F 2203/45026* (2013.01); *H03F 2203/45222* (2013.01)

(58) Field of Classification Search
USPC .......................................... 330/260, 258, 252
IPC ......................................................... H03F 3/45
See application file for complete search history.

(56) References Cited

U.S. PATENT DOCUMENTS

| 4,731,588 | A | | 3/1988 | Addis et al. | |
|---|---|---|---|---|---|
| 5,307,024 | A | | 4/1994 | Metz et al. | |
| 5,483,194 | A | * | 1/1996 | Genest | H03F 3/45179 327/359 |
| 5,684,431 | A | * | 11/1997 | Gilbert | H03G 7/06 330/254 |
| 7,342,451 | B2 | * | 3/2008 | Brueske | G06G 7/24 330/254 |
| 2007/0018725 | A1 | * | 1/2007 | Morikawa | H03F 3/45197 330/253 |
| 2007/0030070 | A1 | * | 2/2007 | Brueske | H03F 3/68 330/260 |
| 2010/0246858 | A1 | * | 9/2010 | Enjalbert | H03F 1/0211 381/120 |
| 2014/0139289 | A1 | * | 5/2014 | Draxelmayr | H03F 3/45632 330/257 |

OTHER PUBLICATIONS

C. Toumazou, F. J. Lidgey, and D. Haigh, Analogue IC Design: The Current-mode Approach, textbook, Circuits, Devices and Systems, Peregrinus, 1993, pp. 1-3 & 11-21.

* cited by examiner

*Primary Examiner* — Patricia T Nguyen
(74) *Attorney, Agent, or Firm* — Edward C. Kwok; Hogan Lovells US LLP

(57) ABSTRACT

A DC-coupled differential amplifier has an output common-mode voltage near the ground reference. A feedback circuit superimposed on a trans-linear loop improves linearity and extends the bandwidth of the basic PNP differential pair.

4 Claims, 2 Drawing Sheets

LINEAR BROADBAND PNP AMPLIFIER

BACKGROUND OF THE INVENTION

1. Field of the Invention

The present invention relates to analog circuit design. In particular, the present invention relates to a linear broadband PNP amplifier with a low output common mode voltage.

2. Discussion of the Related Art

There is a need for a DC-coupled differential amplifier with an output common-mode voltage that is below 1 V. Fast and linear pipe-lined analog-to-digital converters (ADCs) built with fine-line CMOS technologies operate at low power supplies (e.g., $V_{dd}$=1.8 V). For best dynamic range, the input voltage to such an ADC should be set at half supply (i.e., $0.5 \times V_{dd}$ or 0.9 V). Differential amplifiers used as ADC drivers are generally built using SiGe technology and typically use only NPN transistors as their active elements. In its linear region, such a transistor requires a base-to-emitter voltage ($V_{be}$) of 0.9 V across its base-emitter junction at room temperature. A 0.9 V output common-mode voltage therefore will not support even a simple current source, let alone an amplifier.

FIG. 1 shows PNP differential pair 100 in the prior art, which includes current sources 101-1 and 101-2, PNP transistors Q2B and Q2D, load resistors 102-1 and 102-2 (each having resistance value $R_2$) and resistors 103-1 and 103-2 (each having resistance value $R_1$). The gain in PNP differential pair 100 is set by the resistance values $R_1$ and $R_2$. PNP differential pair 100 provides an output differential signal across terminals 104-1 and 104-2. While PNP differential pair 100 can support an output common-mode voltage near the ground reference, a lower transistor frequency ($f_T$) and a lower common-emitter current gain ($\beta$), as compared to an NPN transistor, limit both bandwidth and linearity.

U.S. Pat. No. 4,731,588, to Addis et al., entitled "Gain Selectable Amplifier with Resonance Compensation," issued on Mar. 15, 1988, and U.S. Pat. No. 5,307,024 to Metz et al., entitled "Linearized level-shifting amplifier," issued on Apr. 26, 1994, disclose voltage feedback linearization techniques. However, these feedback linearization techniques are not applicable to PNP differential amplifiers when its linearity is limited by the lower current gain ($\beta$). The textbook "*Analogue IC Design: The Current-mode Approach*," by C. Toumazou, F. J. Lidgey, and D. Haigh, Circuits, Devices and Systems, Peregrinus, 1993, pp. 11-21, suggests current-mode techniques which overcome this limitation.

SUMMARY

According to one embodiment of the present invention, a differential amplifier includes a differential pair, and a trans-linear loop and a feedback loop on each side of the differential pair. Each trans-linear loop includes transistors that, together with the corresponding input transistor of the differential pair, form a closed loop of base-emitter junctions. In addition, each trans-linear loop also includes a current source designed such that the ratio of the currents carried in that current source and in a corresponding current source of the differential pair are substantially the same as the ratio of the emitter area of one of the transistors in the trans-linear loop and the emitter area of the corresponding input transistor of the differential pair. The trans-linear loops allow the differential amplifier to operate at a common mode voltage that is close to the ground reference. Each feedback loop compensates the corresponding trans-linear loop for changes in the base current in the corresponding input transistor of the differential pair to ensure linearity in the differential amplifier over a wide bandwidth.

The present invention is better understood upon consideration of the detailed description below in conjunction with the accompanying drawings.

BRIEF DESCRIPTION OF THE DRAWINGS

To facilitate cross-referencing among the figures, like elements are assigned like reference numerals in the figures.

DETAILED DESCRIPTION OF THE PREFERRED EMBODIMENTS

Figure 1:
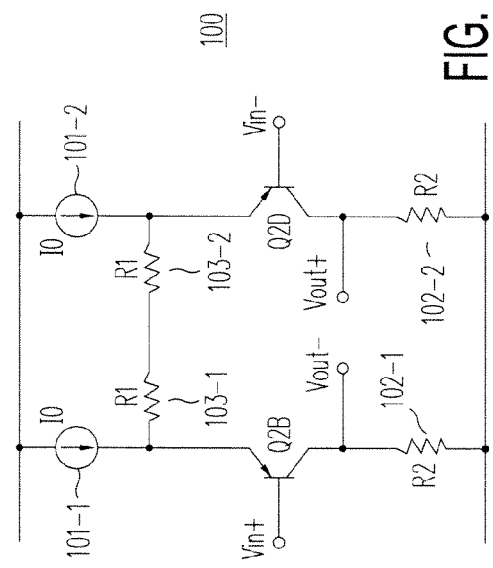
FIG. 1 shows PNP differential pair 100 in the prior art.
Figure 2:
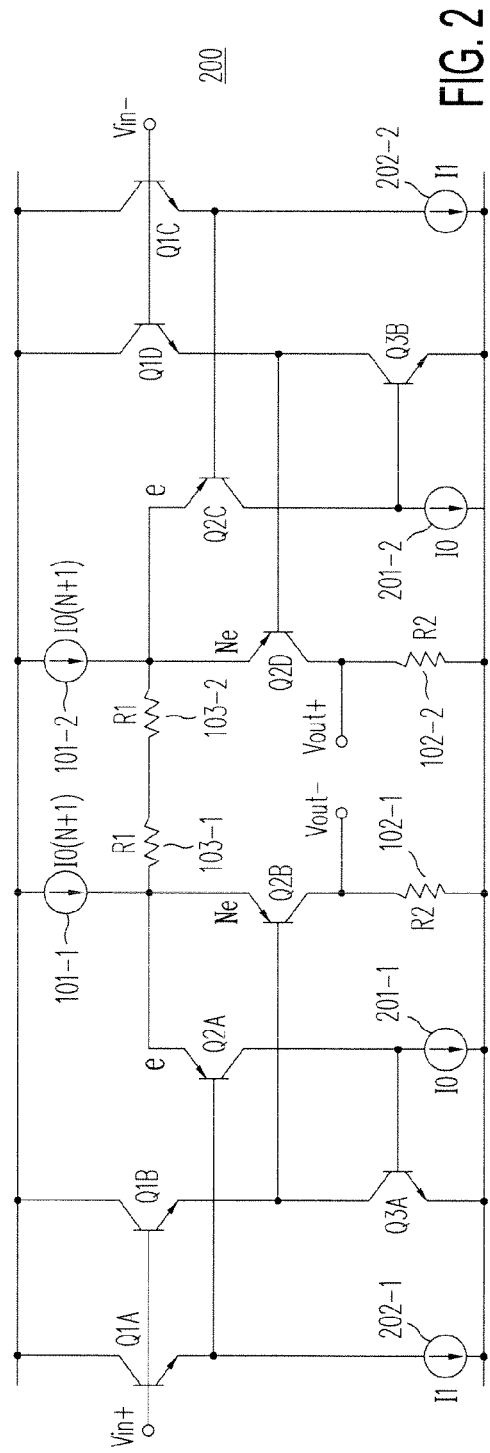
FIG. 2 shows DC-coupled differential amplifier 200, in accordance with one embodiment of the present invention.

FIG. 2 shows DC-coupled differential amplifier 200, in accordance with one embodiment of the present invention. DC-coupled differential amplifier 200 has an output common-mode voltage near the ground reference. As shown in FIG. 2, differential amplifier 200 includes PNP differential pair 100, and additional components. The gain in DC-coupled differential amplifier 200 is also set by the resistance values $R_1$ and $R_2$ of resistors 102-1, 102-2, 103-1 and 103-3, respectively. The additional components form a trans-linear loop and a feedback loop on each side of PNP differential pair 100.

Figure 3:
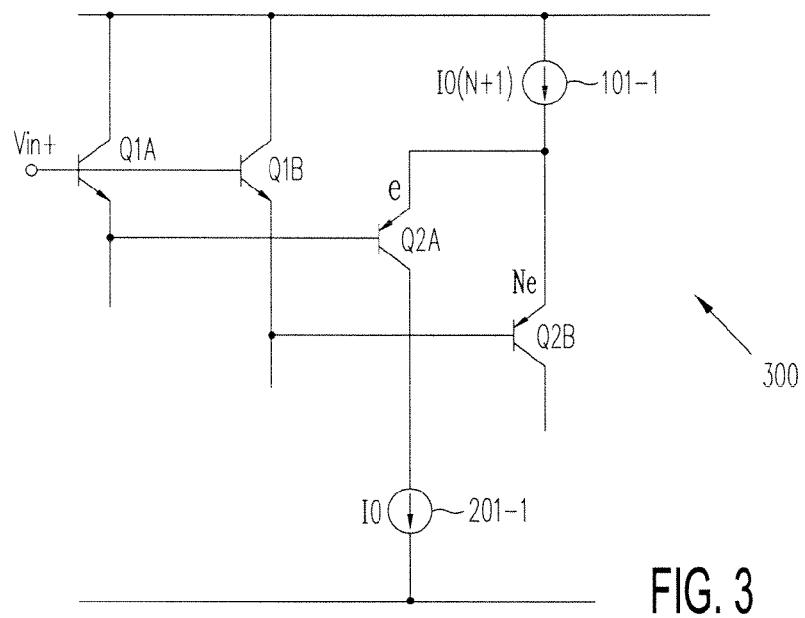
FIG. 3 shows trans-linear loop 300, comprising the elements of the trans-linear loop on the side of PNP transistor Q2B of PNP differential pair 100.

FIG. 3 shows trans-linear loop 300, comprising the elements of the trans-linear loop on the side of PNP transistor Q2B of PNP differential pair 100. As shown in FIG. 3, NPN transistor $Q_{1A}$, PNP transistor Q2A, PNP transistor Q2B, and NPN transistor Q1B form a closed loop of base-to-emitter junctions. By design, transistor Q2A has an emitter area e and transistor Q2B has an emitter area Ne, where N is an integer (e.g., 5). Current sources 101-1 and 201-1 are designed to provide currents of values $I_0$ and $(N+1)I_0$, respectively, so as maintain the current densities of transistors Q2A and Q2B substantially the same. Thus, trans-linear loop 300 imposes the following constraints on DC-coupled differential amplifier 200:

$$V_{be,1A} + V_{be,2A} = V_{be,2B} + V_{be,1B}$$

$$J_{1A} \times J_{2A} = J_{1B} \times J_{2B}$$

where $V_{be,1A}$, $V_{be,2A}$, $V_{be,2B}$, and $V_{be,1B}$ are the base-emitter voltage in transistors Q1A, Q2A, Q2B and Q1B, respectively; $J_{1A}$, $J_{2A}$, $J_{1B}$, and $J_{2B}$ are the current densities in the emitters of transistors Q1A, Q2A, Q1B, and Q2B, respectively. The emitter current density is given by the ratio of emitter current $I_E$ to emitter area A. The same operation is expected of the trans-linear loop on the side of PNP transistor Q2D of PNP differential pair 100.

Figure 4:
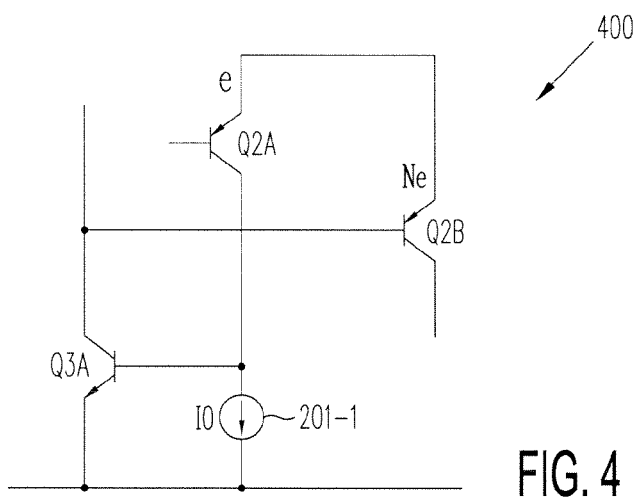
FIG. 4 shows feedback loop 400, comprising the elements of the feedback loop on the side of PNP transistor Q2B of PNP differential pair 100.

FIG. 4 shows feedback loop 400, comprising the elements of the feedback loop on the side of PNP transistor Q2B of PNP differential pair 100. As shown in FIG. 4, feedback loop 400 comprises PNP transistor Q2A, current source 201-1, PNP transistor Q2B, and NPN Q3A. Transistor Q3A compensates for any changes in the base current in transistor Q2B, which tracks changes in the load current. If changes in the base current of transistor Q2B are not compensated, the linearity of DC-coupled differential amplifier 200 would be limited. The same operation is expected of the feedback loop on the side of PNP transistor Q2D of PNP differential pair 100.

The above detailed description is provided to illustrate the specific embodiment of the present invention and is not intended to be limiting. Numerous variations and modifications within the scope of the present invention are possible. The present invention is set forth in the accompanying claims.

I claim:

1. A differential amplifier, comprising:
    a differential pair comprising a first transistor and a second transistor, and a first current source and a second current source, the first current source and second current source providing a collector-emitter current of the first transistor and a collector-emitter current of the second transistor, respectively;
    a first trans-linear loop and a second trans-linear loop coupled to a base terminal and an emitter terminal of the first transistor and a base terminal and an emitter terminal of the second transistor, respectively, wherein each trans-linear loop comprises:
        a third transistor, a fourth transistor and a fifth transistor, connected such that a corresponding one of the first transistor and the second transistor, the third transistor, the fourth transistor and the fifth transistor form a closed loop of base-emitter junctions; and
        a third current source, wherein a current in a corresponding one of the first current source and the second current source and a current in the third current source are provided in substantially the same ratio as an area of the emitter terminal of the corresponding one of the first transistor and the second transistor to an area of an emitter terminal of the fifth transistor; and
    a first feedback loop and a second feedback loop coupled to the base and the emitter terminals of the first transistor and the base and the emitter terminals of the second transistor, respectively, wherein each feedback loop comprising a sixth transistor having a base terminal connected to a collector terminal of the fifth transistor of the corresponding one of the first trans-linear loop and the second trans-linear loop and a collector terminal connected to an emitter terminal of the fourth transistor of the corresponding one of the first trans-linear loop and the second trans-linear loop.

2. The differential amplifier of claim 1, wherein the first transistor, the second transistor and the fifth transistor of each of the first trans-linear loop and the second trans-linear loop are PNP transistors.

3. The differential amplifier of claim 2, wherein the third transistor and the fourth transistor of each of the first trans-linear loop and the second trans-linear loop are NPN transistors.

4. The differential amplifier of claim 3, wherein the sixth transistor is a NPN transistor.

* * * * *